(12) United States Patent
Saule et al.

(10) Patent No.: US 7,842,905 B2
(45) Date of Patent: Nov. 30, 2010

(54) METHOD AND DEVICE FOR THE THERMAL TREATMENT OF SUBSTRATES

(75) Inventors: Werner Saule, Bretten (DE); Lothar Berger, Illingen (DE); Christian Krauss, Gomaringen (DE); Robert Weihing, Mühlacker (DE)

(73) Assignee: Steag Hamatech AG (DE)

( * ) Notice: Subject to any disclaimer, the term of this patent is extended or adjusted under 35 U.S.C. 154(b) by 742 days.

(21) Appl. No.: 11/573,012

(22) PCT Filed: Nov. 12, 2005

(86) PCT No.: PCT/EP2005/012143

§ 371 (c)(1), (2), (4) Date: Jan. 31, 2007

(87) PCT Pub. No.: WO2006/053690

PCT Pub. Date: May 26, 2006

(65) Prior Publication Data

US 2008/0217319 A1 Sep. 11, 2008

(30) Foreign Application Priority Data

Nov. 17, 2004 (DE) .................. 10 2004 055 449

(51) Int. Cl.
- *H05B 3/68* (2006.01)
- *A21B 2/00* (2006.01)
- *C23C 16/00* (2006.01)

(52) U.S. Cl. .............. 219/448.12; 219/444.1; 392/416; 118/724

(58) Field of Classification Search ... 219/443.1–468.2, 219/482–495; 118/724, 725; 392/416, 418
See application file for complete search history.

(56) References Cited

U.S. PATENT DOCUMENTS

| | | | |
|---|---|---|---|
| 5,059,770 A | 10/1991 | Mahawili | |
| 5,996,353 A | 12/1999 | Maxwell et al. | |
| 6,084,215 A * | 7/2000 | Furuya et al. | 219/444.1 |
| 6,384,383 B2 * | 5/2002 | Kano et al. | 219/444.1 |
| 6,469,283 B1 * | 10/2002 | Burkhart et al. | 219/486 |
| 6,512,207 B1 | 1/2003 | Szekeresch et al. | |
| 6,573,031 B2 | 6/2003 | Shinya et al. | |
| 6,639,189 B2 * | 10/2003 | Ramanan et al. | 219/444.1 |
| 6,919,538 B2 | 7/2005 | Szekeresch et al. | |
| 6,951,587 B1 * | 10/2005 | Narushima | 118/728 |
| 2001/0001697 A1 | 5/2001 | Whiting | |
| 2003/0032302 A1 | 2/2003 | Nishi et al. | |
| 2004/0005507 A1 | 1/2004 | Lakkapragada et al. | |

* cited by examiner

*Primary Examiner*—Sang Y Paik
(74) *Attorney, Agent, or Firm*—Robert W. Becker; Robert Becker & Assoc.

(57) ABSTRACT

This invention relates to a method and a device for the thermal treatment of substrates in which the substrates are held in contact with or a small distance away from a heating plate, which is heated by a plurality of separately controllable heating elements on the side of the heating plate facing away from the substrate, the heating plate being surrounded, at least in its plane, by a frame spaced apart therefrom, and gas being conveyed, in a controlled manner, through a gap between the frame and at least one edge of the heating plate.

30 Claims, 7 Drawing Sheets

| step | minutes | ZONE 1 | ZONE 2 | * | ZONE 24 | ZONE 25 | Fan Speed |
|---|---|---|---|---|---|---|---|
| 1 | 0 | 97.47 | 97.47 | * | 110.27 | 110.27 | 12000 |
| 2 | 20 | 99.35 | 99.35 | * | 111.15 | 111.15 | 8000 |
| 3 | 20 | 103.72 | 103.72 | * | 114.89 | 114.89 | 2000 |
| 4 | 20 | 113.77 | 113.77 | * | 122.32 | 122.32 | 2000 |
| 5 | 20 | 119.1 | 119.1 | * | 126.83 | 126.83 | 2000 |
| 6 | 20 | 123.96 | 123.96 | * | 129.8 | 129.8 | 2000 |
| 7 | 20 | 126.59 | 126.59 | * | 132.17 | 132.17 | 2000 |
| 8 | 20 | 129.03 | 129.03 | * | 134.16 | 134.16 | 2000 |
| 9 | 20 | 131.32 | 131.32 | * | 135.5 | 135.5 | 2000 |
| 10 | 20 | 133.03 | 133.03 | * | 136.68 | 136.68 | 2000 |
| 11 | 30 | 134.63 | 134.63 | * | 137.68 | 137.68 | 2000 |
| 12 | 30 | 135.88 | 135.88 | * | 138.22 | 138.22 | 2000 |
| 13 | 30 | 136.4 | 136.4 | * | 138.59 | 138.59 | 2000 |
| 14 | 30 | 136.35 | 136.35 | * | 139.22 | 139.22 | 2000 |
| 15 | 30 | 138.39 | 138.39 | * | 141.39 | 141.39 | 2000 |
| 16 | 30 | 137.52 | 137.52 | * | 140.07 | 140.07 | 2000 |
| 17 | 30 | 137.6 | 137.6 | * | 140.03 | 140.03 | 2000 |
| 18 | 30 | 137.89 | 137.89 | * | 140.39 | 140.39 | 2000 |
| 19 | 30 | 137.83 | 137.83 | * | 140.47 | 140.47 | 2000 |
| 20 | 30 | 137.86 | 137.86 | * | 140.45 | 140.45 | 2000 |
| 21 | 30 | 137.88 | 137.88 | * | 140.39 | 140.39 | 2000 |
| 22 | 30 | 137.82 | 137.82 | * | 140.36 | 140.36 | 2000 |
| 23 | 30 | 137.83 | 137.83 | * | 140.28 | 140.28 | 2000 |
| 24 | 30 | 137.85 | 137.85 | * | 140.35 | 140.35 | 2000 |
| 25 | 0 | 97.47 | 97.47 | * | 110.27 | 110.27 | 8000 |

FIG. 9

METHOD AND DEVICE FOR THE THERMAL TREATMENT OF SUBSTRATES

This specification for the instant application should be granted the priority date of Nov. 17, 2004, the filing date of the corresponding German patent application 10 2004 055 449.8 as well as the priority date of 12 Nov. 2005, the filing date of the corresponding International patent application PCT/EP2005/012143.

BACKGROUND OF THE INVENTION

This invention relates to a method and a device for the thermal treatment of substrates, in particular flat substrates in the production of semiconductors.

When producing components in the field of the semiconductor industry, it is known to treat substrates thermally in a heating device, as is known, for example, from DE 100 59 885 C1, which derives from the applicant of the present application, or from DE 199 07 497 C, which also derives from the applicant. A common process step is, for example, the hardening of a lacquer after lacquering, and the so-called "Post-Exposure Bake" (PEB) for fixing "Chemically Amplified Resists" (CAR) after an exposure. For the quality of the structures and the result of the thermal treatment an even, homogeneous supply of heat info the substrate, in particular into a layer thereon, is of decisive significance. This is not easily possible in particular with angular substrates with a great material thickness, such as for example photomasks, because during the heating of the substrate there is more mass to he heated in the center relative to the edges, and the center therefore warms up more slowly relative to the edges. On the other hand, after reaching a final temperature, the edges radiate more heat relative to the center due to the greater surface such that they cool down more quickly after reaching the final temperature. This same problem also occurs of course with round semiconductor substrates.

In order to overcome this problem, in the past a heating device with several actively regulated zones was used, as is known from the aforementioned DE 189 07 497 C, as was a self-optimizing control method according to DE 100 59 666 C1. By means of these healing devices it was possible to heat the center of a substrate during the heat-op phase more strongly relative to the edges, and after reaching the final temperature, to heat the edges more strongly relative to the center.

Although the known device and the known control method bring good results, there is still the need to further increase the temperature homogeneity during thermal treatments, in particular for photomasks of the next generation (65 nm node).

Starting from the known prior art, it is therefore an object of the present invention to provide a method and a device for the thermal treatment of substrates with which improved homogeneity of a thermal treatment can be achieved.

SUMMARY OF THE INVENTION

According to the invention, this object is fulfilled by a method for the thermal treatment of substrates, in which the substrates are held In contact with or a small distance away from a heating plate which is heated by a plurality of separately controllable heating elements on the side of the heating plate facing away from the substrate, wherein the healing plate is surrounded, at least in its plane, i.e., radially, by a frame spaced apart from said heating plate, wherein a gas is conveyed through a gap between the frame and at least one edge of the heating plate, the gas being conveyed such that it does not come into contact with the substrate, and wherein the flow-through quantity and/or the temperature of the gas is controlled to influence the temperature of the edge of the beating plate. By producing a gap between a frame and a heating plate and by means of the controlled conveyance of gas through this gap, active cooling of edge regions of the heating plate is possible to thereby enable improved homogeneity of a thermal treatment of a substrate. The controlled conveyance of gas through a gap makes possible, in addition to other control parameters, specific cooling of an edge region of a heating plate in order, for example, to heat the substrate less relative to the center during a heat-up phase. The active cooling makes possible a fast change, in particular reduction, of the temperature of the edge region of the heating plate. A reduction of the temperature in the edge region of the heating plate is achieved substantially faster than could be achieved, for example, by a reduction in the supply of energy to one of the heating elements in the edge region.

The method according to the invention thus makes possible a thermal treatment of substrates with improved temperature homogeneity.

According to a preferred embodiment of the invention, the width of the gap along at least one partial region of an edge of the heating plate is changed before and/or during a thermal treatment of a substrate In order to adjust the flow rates in the region of the gap, and to thereby change the cooling in this region. By means of this, a specific asymmetrical cooling of edge regions of the heating plate can be achieved in order to for example even out asymmetries in the heating behavior of the heating device. In so doing, the width is changed locally, preferably in a range between 0 and 5 mm, and in particular between 1 and 5 mm.

For good conveyance of the gas, it is preferably diverted by a deflection element before entering the gap in order to provide specific cooling in the region of the edge of a heating plate. In a particularly preferred embodiment of the invention, the gas is ambient air. Because the ambient air is guided through the gap, the structure of the device is particularly simple. Because the above method generally takes place in clean rooms in which climatised air is provided, good and even cooling can be achieved with the ambient air because the temperature of the ambient air is generally known and constant.

In an alternative embodiment the gas is a cooling gas which circulates in a substantially closed cooling circuit. The use of a cooling gas, which can also be air, and which circulates in a substantially closed cooing circuit, makes it possible to control not only the quantity of gas flowing through the gap, but also the temperature of the gas, by means of which the cooling in the edge region of the heating plate can he controlled even better.

Advantageously, the quantity of gas conveyed through the gap, the gap width and/or the temperature of the gas are controlled by means of a profile established before the thermal treatment in order to provide a respective predetermined cooling of an edge region of the heating plate during different process stages.

In a further embodiment of the invention, the temperature is measured location-specific on the side of the substrate facing away from the heating plate, and the profile for the quantity of gas conveyed through the gap established before the thermal treatment, the gap width and/or the temperature of the gas is changed in accordance with the temperature distribution measured on the substrate, if temperature differences between different location points on the surface of the substrate exceed a threshold value. In this way, rapid control and regulation of the temperature of an edge region of a heating plate is possible in accordance with a temperature distribution on the substrate.

Preferably, a profile which is changed during a thermal treatment for the quantity of gas conveyed through the gap, the gap width and/or the temperature of the gas is preferably stored, and used as a newly established profile for a subsequent treatment in order to make possible an anticipatory control and self-optimization of the predetermined profile.

Alternatively, or in addition, the temperature is measured location-specific on the side of the substrate facing away from the heating plate, the temperature of each heating element is measured and the temperature of each heating element is regulated using a PID regulation algorithm in which the measured temperature of the heating element is entered as an actual value, and a desired value profile of the temperature for the PID regulation algorithm determined before the thermal treatment is changed In accordance with the temperature measured on the substrate, if the temperature differences between different locations on the surface of the substrate exceed a threshold value.

In order to provide a self-optimizing process control, a desired value profile changed during a thermal treatment is preferably stored, and Is used for a subsequent treatment as a new established desired value profile.

According to a further embodiment of this invention, a structure width, in particular a lacquer structure width, is measured location-specific on the surface of a substrate after a thermal treatment, and by means of the measurement, a location-specific temperature profile is calculated for the surface of the substrate which occurred during the thermal treatment, wherein the quantity of gas conveyed through the gap, the gap width and/or the temperature of the gas is set in accordance with the temperature profile calculated on the substrate for a subsequent thermal treatment process. In this way, once again a self-optimisation of the process is possible because the inhomogeneities occurring in a previous treatment process can be taken into account by changing a control profile for a subsequent treatment.

The object which forms the basis of the invention is also fulfilled with a device for the thermal treatment of substrates, comprising a heating plate, means for holding a substrate in contact with or a small distance away from the heating plate, a plurality of separately controllable heating elements on the side of the heating plate facing away from the substrate, a frame which surrounds the heating plate In its plane, i.e. radially, the frame being spaced apart from the heating plate and forming at least one gap between the frame and at least one edge of the heating plate, and at least one device for conveying gas through the gap, the device controlling the quantity and/or the temperature of the gas conveyed through the gap, and wherein means are provided for guiding the gas such that it does not come info contact with the substrate. The above device once again enables a quick response temperature control of an edge region of a heating plate by controllably conveyed gas through a gap between an edge of a heating plate and a frame.

In order to he able to control the cooling of individual edge regions, preferably at least one element, which is adjustably mounted to the frame, is provided for local adjustment of the width of the gap. In this way, the cooling profile can be adjusted, and in particular also an asymmetrical cooling profile along at least one edge of the heating plate may be achieved to counter asymmetrical heating of the heating plate. Preferably, the gap can be adjusted locally between 0 and 5 mm, and in particular between 1 and 5 mm.

According to a preferred embodiment of the invention, a plurality of elements are provided along one edge of the heating plate in order to provide different cooling profiles along the edge. A contour of the element facing towards the heating plate is preferably complementary to a contour of the opposite edge of the heating plate so as to produce a substantially constant gap in the region of a respective element.

For a simple structure of this invention, the frame preferably has a bottom wall and at least one side wail, the at least one side wall radially surrounding the heating plate. A flow space is formed above the bottom wall which is connected to the gap, the controllable device for conveying gas through the gap being connected to an opening in the bottom wail of the frame. By means of this, air can be sucked or pushed through the gap in a simple manner by means of a flow space formed below the heating plate, wherein a space between the bottom wall of the frame and the heating plate serves as a distribution space which facilitates even sucking-in and blowing-out of air through the gap.

Preferably, a deflection element is provided which is in contact with the heating plate in an edge region on its upper side, and forms a flow channel at one end of the gap. In this way, controlled conveyance of gas through the gap and controlled cooling of the heating plate at Its edge region is facilitated.

For a simple structure of the device, the gap is in contact with ambient air so that ambient air can be conveyed through the gap for cooling. In order to achieve even better cooling or cooling control, in an alternative embodiment the gap forms part of a substantially closed flow circuit in which a cooling and/or heating device is disposed.

Preferably, a location-specific temperature measurement device directed onto the surface of the substrate facing away from the heating plate and a process control unit, which is connected to the temperature measurement device and the controllable device for conveying gas through the gap, are provided, in order to establish the temperature distribution on the substrate surface, and to control the controllable device for conveying gas through the gap in accordance with the temperature distribution. This enables the adaptation of the cooling to a temperature distribution on a substrate surface during a thermal treatment process For good control of the individual heating elements, a temperature sensor is preferably allocated to each heating element in order to measure its temperature: and furthermore at least one PID regulator is provided which is connected to the heating elements and the allocated temperature sensors In order to enable temperature regulation of the individual heating elements during a thermal treatment. Preferably, a PID regulator is provided here for each heating element in order to guarantee constant real time regulation. If just one PID regulator is provided, regulation of the individual heating elements could be performed sequentially. Thus, regulation of all heating elements is possible with a single PID regulator, however during intervals spaced out over time.

Preferably, the process control unit Is connected to the PID regulator(s) and establishes, dependent upon the temperature distribution on the substrate surface, desired temperature values for the individual heating elements, and communicates these to the PID regulators). In this way, an external intervention into and an adaptation of the desired temperature values for the individual PID regulators upon the basis of a temperature distribution on the substrate surface is made possible, by means of which the regulation of temperature homogeneity can be improved.

According to a particularly preferred embodiment of the invention, the controllable device for conveying gas through the gap is disposed centrally below the heating plate in order to facilitate even conveyance of gas relative to the side edge(s) of the heating plate. This controllable device for conveying gas through the gap is preferably a suction device which, for example, sucks ambient air through the gap.

With a particularly preferred embodiment of the invention, the controllable device for conveying gas through the gap has a control unit in order to adjust the quantity of gas conveyed through the gap and/or the temperature of the gas.

BRIEF DESCRIPTION OF THE DRAWINGS

In the following, the present invention is described In greater detail using the drawings; the drawings show;

FIG. 9 a graphical illustration of an optimized heating program according to the invention;

DESCRIPTION OF SPECIFIC EMBODIMENTS

Figure 1:
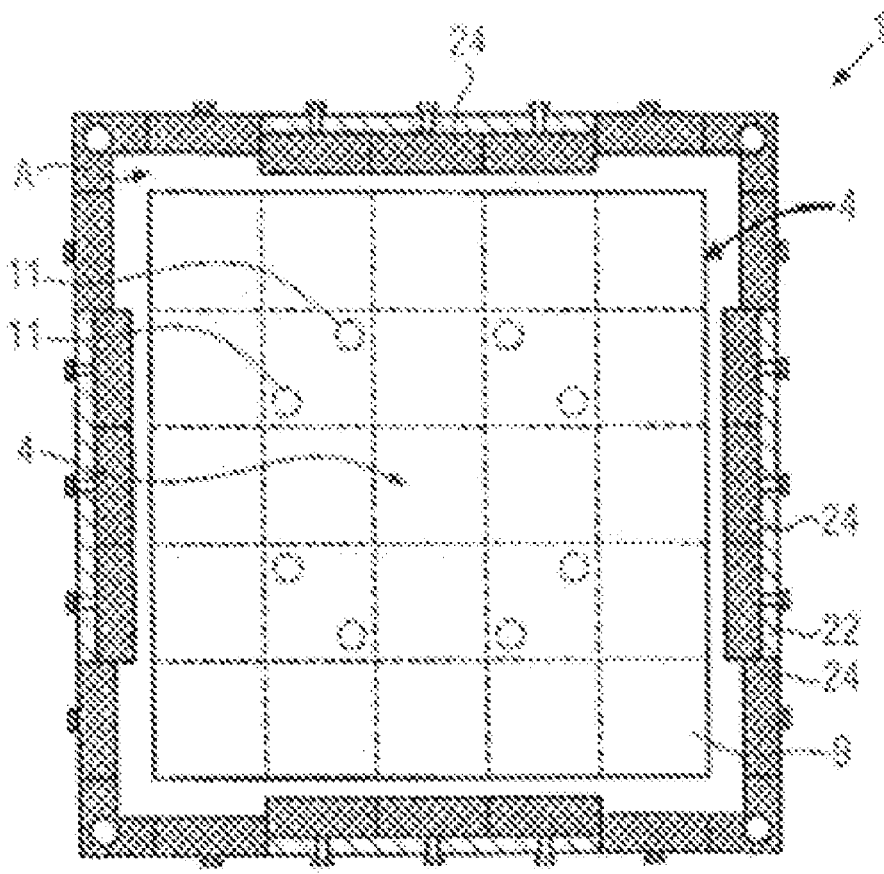
FIG. 1 a schematic top view of a heating device of this invention, wherein certain elements have been omitted in order to simplify the illustration.
Figure 2:
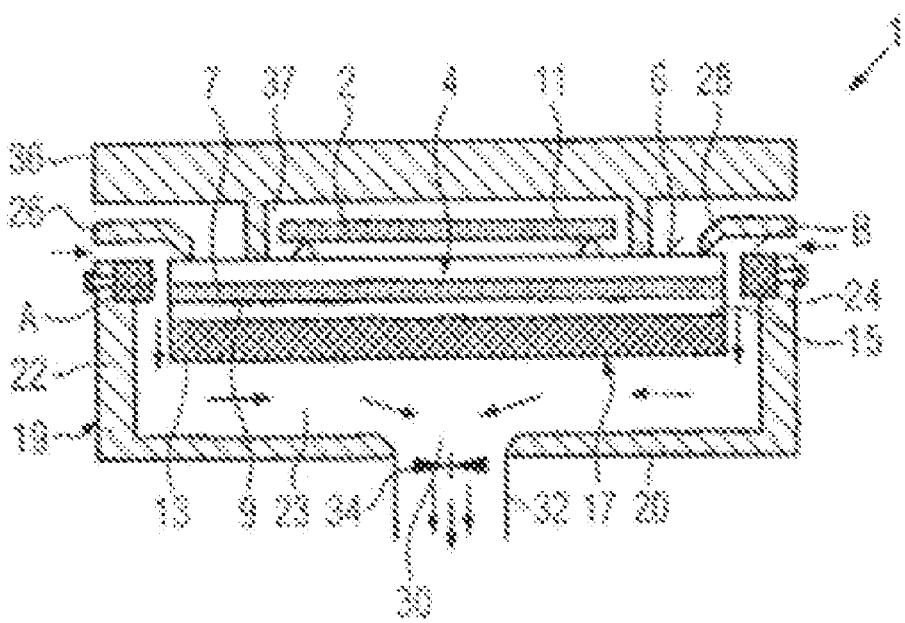
FIG. 2 a schematic cross-sectional view of the device according to FIG. 1.

FIGS. 1 and 2 show a schematic top view of a device 1 for the treatment of substrates 2 and a cross-sectional view of the same according to a first example of an embodiment of the invention. In the top view of FIG. 1, certain elements, which can be seen in FIG. 2, however, have been omitted in order to clarify the present invention.

The device 1 has a flat, in the top view square heating plate 4 with an upper side 6 and a rear side 7. On the rear side 7, heating elements 9 are mounted, a total of 26 heating elements 9 being provided, as shown in the top view according to FIG. 1. In or on the heating plate, supporting elements 11 are provided which are either fixed or height-adjustable in order to raise or lower a substrate 2 lying thereon. As can be seen in the top view of FIG. 11 a total of 8 supporting elements 11 are provided, although of course, a number different to this can also be provided.

As can he seen in the sectional view according to FIG. 2, below the heating elements 9 an insulating plate 13 is provided which is separated from the heating elements by a narrow air gap 16. The air gap 15 serves as a feed space for electric cables etc. for controlling the heating elements 9. Alternatively however, the insulating element 13 could also be directly in contact with the rear side of the heating elements 9 provided corresponding feed lines are provided in the insulating element. Furthermore, to each heating element a temperature sensor is allocated which is attached, for example, to a rear side of each heating element.

The heating plate 4, the heating elements 9, and the insulating element 13 are connected to one another In a known manner so as to form a heating plate unit 17. The heating plate unit 17 is accommodated within an outer frame element 19, and is supported within this by holding elements (not shown). The frame element 19 substantially comprises a bottom wall 20 and corresponding side walls 22. With the embodiment shown, four side walls 22 are provided which form a square frame. On an upper end of the side walls 22, a total of five elements 24, which are adjustable In the horizontal direction, are respectively provided, the function of which will be described in greater detail in the following.

The heating plate unit 17 is disposed centrally within the frame element 19, wherein the adjustable elements 24 are arranged at the height of the heating plate 4 with the heating elements 9 lying below them.

The side walls 22 with the adjustable elements 24 surround the heating plate unit 17 in the radial direction, such that a gap A is formed between the heating plate unit 17 and the side walls 22. By means of the adjustable elements 24, the width of gap A can be changed locally in a range of between 0 mm and 5 mm, i.e. the gap can be fully closed locally if no cooling is to be provided along an edge region. This gap closure is only provided, however, in local sections. Preferably however, adjustment of the gap width only takes place in a range of between 1 and 5 mm, as will be described in greater detail below. A pre-setting of the elements 24 is chosen here such that the gap A in the region of the corners of the square heating plate is greater than in the other regions, as can be seen in the top view according to FIG. 1. Furthermore, between the bottom wall 20 of the frame element and the lower side of the heating plate unit, a flow space 23 is formed which adjoins the gap A.

As part of the frame, a deflection element 26 is provided, which is in contact with the heating plate 4 on its upper side 6. Between the deflection element 26 and an upper side of the side wall 22, a flow opening B is provided. By means of an inclined section 28 of the deflection element 26, a flow of air passing through the flow opening B is deflected towards the gap A and a flow of air emerging upwardly through the gap A is deflected radially outwardly. Of course, the deflection element 26 can also be provided separately from the frame 18. The effect of the deflection element is that the air flowing through the gap does not come into contact with the substrate to be treated.

The bottom wall 20 of the frame element 19 has a centered middle opening 30 to which a suction pipe 32 adjoins. In the region of the suction pipe 32, a regulatable blower 34 is provided in order to suck in gas, preferably ambient air, through the flow opening B, the gap A and the flow space 23, and to expel it through the suction pipe.

As can be seen in FIG. 2, the device 1 furthermore has a cover 36 which, in a closed state, is in contact with the upper side of the heating plate, and forms an accommodation space 37 for the substrate 2. The cover 36 is movable, in an appropriate way, relative to the frame element 19 or side walls 22 and the heating plate unit 17 in order to form a substantially closed accommodation space 37 between the upper side 6 of the heating plate 4 and the cover 36. On the cover 36, a temperature measurement device (not shown in detail) is provided which undertakes location-specific temperature measurements on an upper side of the substrate 2. The results of this type of temperature measurement are supplied to a control device (not shown in detail).

In the following, the operation of the heating device 1 according to FIGS. 1 and 2 is described in greater detail.

First of all, with the cover 38 open, a substrate 2 is laid on the supporting elements 11. The cover 36 is then closed so as to form the substantially closed accommodation space 37, as shown in FIG. 2.

Next, the heating elements 9 are controlled according to a predetermined heating profile, and the blower according to a predetermined blower profile which were established, for example, during a calibration process for the desired thermal treatment process.

Figure 3:
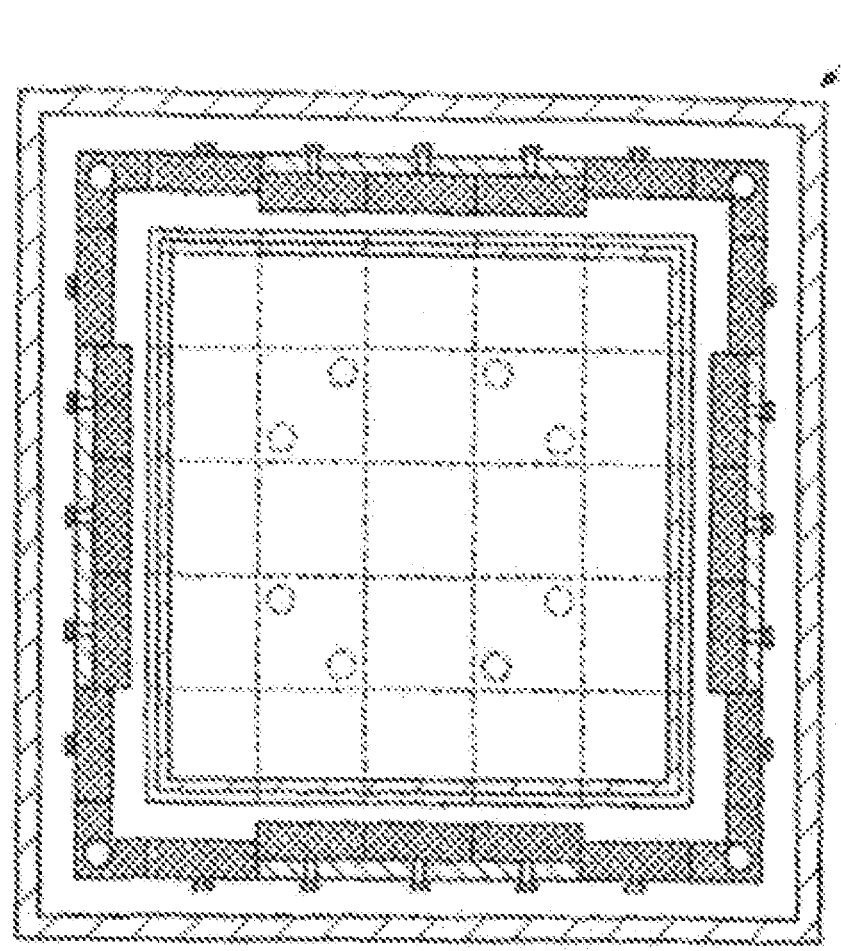
FIG. 3 a schematic sectional view of an alternative embodiment of a heating device according to the invention along line III-III in FIG. 4.

A corresponding process program with heating and blower profiles is shown schematically in FIG. 3. FIG. 9 shows the temperature to be reached for individual heating elements during different phases of the thermal treatment and a corresponding blower setting during the different phases.

The heating profile of the Individual heating elements 9 is designed such that the most even temperature distribution possible is achieved on an upper side of the substrate 2 facing away from the heating plate 4. The individual heating elements 9 are controlled by means of a PID regulation algorithm in which the measurement results of the temperature sensors allocated to the respective heating elements 9 are entered as actual values, whereas the predetermined temperatures shown in FIG. 9 for the different phases of the thermal treatment represent desired values.

Correspondingly, the blower 34 is controlled according to the predetermined blower profile in order to suck in ambient air via the flow channel B and the gap A, which air thus flows along the outer edges of the heating plate 4 and the externally positioned heating elements 9. The blower is also controlled according to the previously established program in the predetermined way in order to achieve corresponding edge cooling of the heating plate 4 and the externally positioned heating elements 9.

Although the process program established once for the subsequent processes could be used without any change, in the embodiment shown, monitoring of the process results and, if appropriate, adaptation of the process program is provided.

Figure 7:
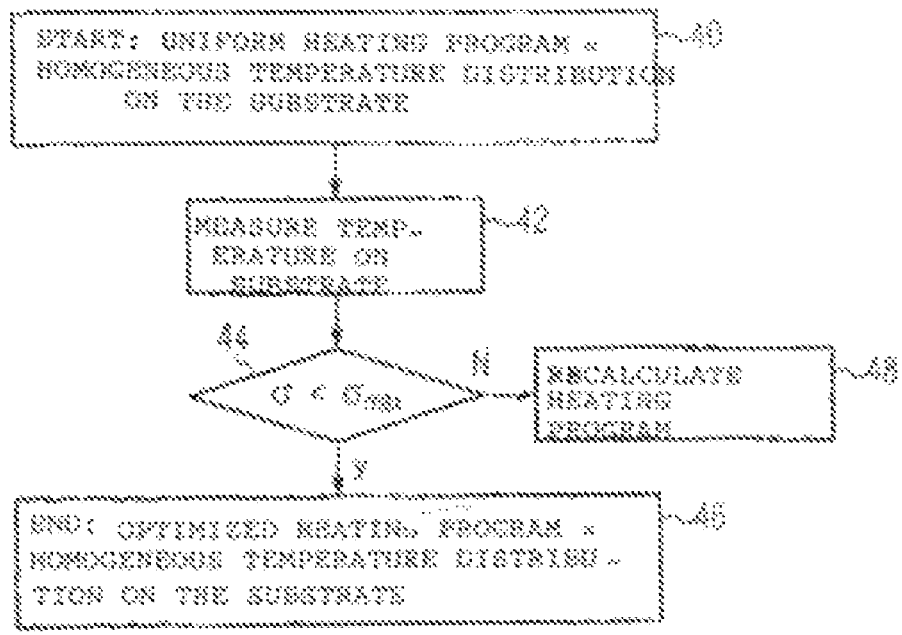
FIG. 7 an illustration of the regulation circuit for the automatic optimization of a heating program.

As an example of this type of monitoring and adaptation, FIG. 7 shows a schematic representation of a flow chart for automated optimization of a process program. According to FIG. 7, in block 40 a thermal treatment of a substrata is started using the predetermined process program. Then, in block 42, the temperature on the surface of the substrate facing away from the heating plate is measured location-specific, i.e. at different location points, during the thermal treatment. From the measurement results, which originate from different location points on the upper side of the substrate, a homogeneity of the temperature distribution is calculated, represented by $\delta$. The homogeneity $\delta$ is given by the coefficient:

$$\sum_{\Delta t} \frac{\Delta T(t)}{T(t)} \bigg/ \Delta t$$

In a decision block 44, the calculated homogeneity is compared with a maximum homogeneity value which represents a maximum allowed temperature deviation. If the homogeneity $\delta$ is less than the maximum allowed homogeneity value $\delta_{max}$, the process program is then continued, unchanged, until the end is reached. At the end of the process program, in step 46 the control of the individual heating elements 9 and of the blower 34 is ended, and then the substrate 2 is unloaded in a known manner.

If, however, it is determined in block 44 that the homogeneity $\delta$ exceeds the maximum allowed homogeneity value $\delta_{max}$, then in step 48 the process program is recalculated, and the heating profile and/or the blower profile is/are changed in order to achieve a more even temperature distribution over the substrate. When recalculating the process program, the previously determined desired value profiles for the individual heating elements can in particular, be changed with respect to their original specification. This type of process control is described, for example, for the control of the heating elements in DE 199 07 497 C2 to which reference is made in order to avoid repetitions. This type of process control serves to achieve improved temperature homogeneity on the surface of the substrate 2.

Alternatively or in addition to this, the control of the blower 34 can also be changed with respect to the predetermined blower profile in order to provide rapid edge cooling of the heating plate 4 or of the externally positioned heating elements 9 or less pronounced cooling of the same.

It is also possible to change the width of gap A along the peripheral edge of the healing plate 4 or the externally positioned heating elements 9. This change of the gap width can be provided along just one or also along several edges, and also only in partial regions so as to specifically change the cooling activity provided by the air flow in the region where an adjustment is provided.

Thus, a wide variety of possibilities are offered in order to achieve homogenization of the temperature on the surface of the substrate 2.

The recalculated and changed process program is stored in block 46 after the end of the thermal treatment, and prepared as a new process program for a subsequent thermal treatment. In this way, during the thermal treatment a plurality of substrates 2 can achieve self-optimization of the system.

Figure 8:
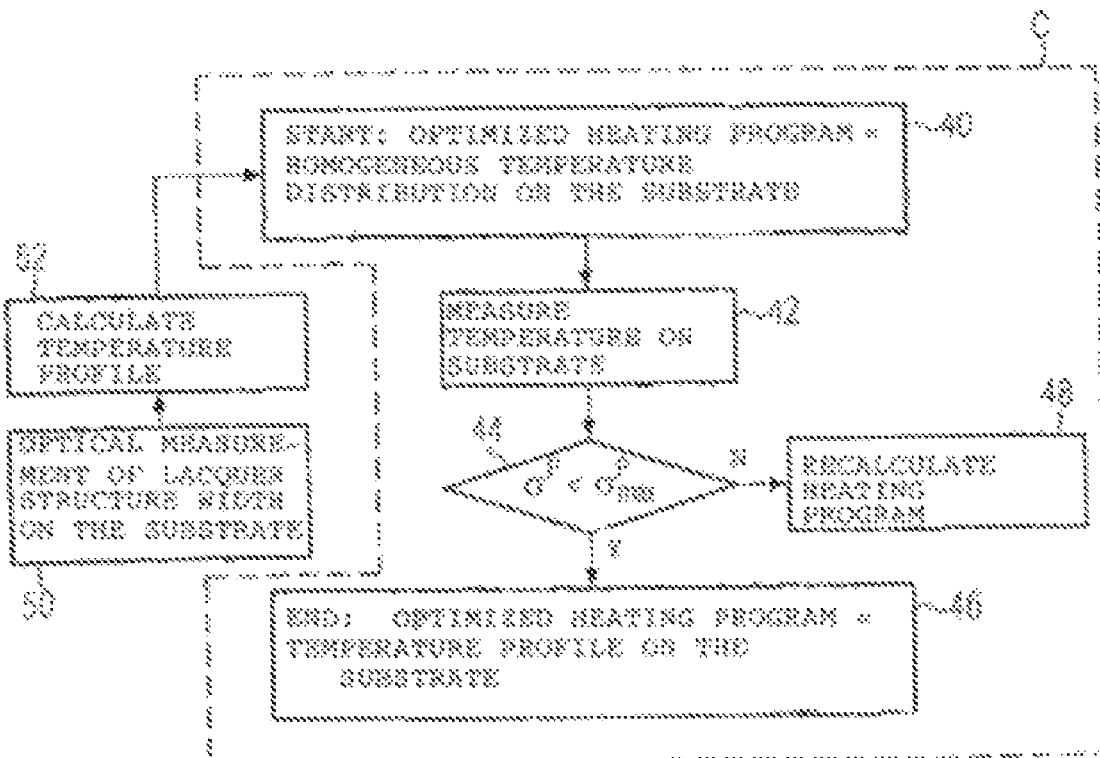
FIG. 8 an alternative illustration of a regulation circuit for the automatic optimization of a heating program, taking into account lacquer structure widths on the substrate.

FIG. 8 shows an alternative flow chart for automatic optimization of the heating program, wherein section C according to FIG. 8 substantially corresponds to the previously described flow chart. In section C the same reference numbers are used as in FIG. 7. An optical measurement of the lacquer structure width on a previously treated substrate is, however, added upstream of section C. This optical measurement is, once again, location-specific in order to establish local differences with regard to the lacquer structure width on the substrate which, once again, allows an inference with regard to the local temperature profile on the surface of the substrate during the thermal treatment, as described, for example, in U.S. Pat. No. 8,235,439 B. The optical measurement of the lacquer structure width takes place in block 50. In the following step 52, the temperature profile is calculated location-specific during the previous thermal treatment, and an optimized process program is established using the temperature profile, the aim of which is to achieve more homogeneous temperature distribution on the substrate. This process program optimized in this way is then used in block 40 as the start program which, if so required, is changed once again, as described above, during the thermal treatment, and then stored.

Figure 5:
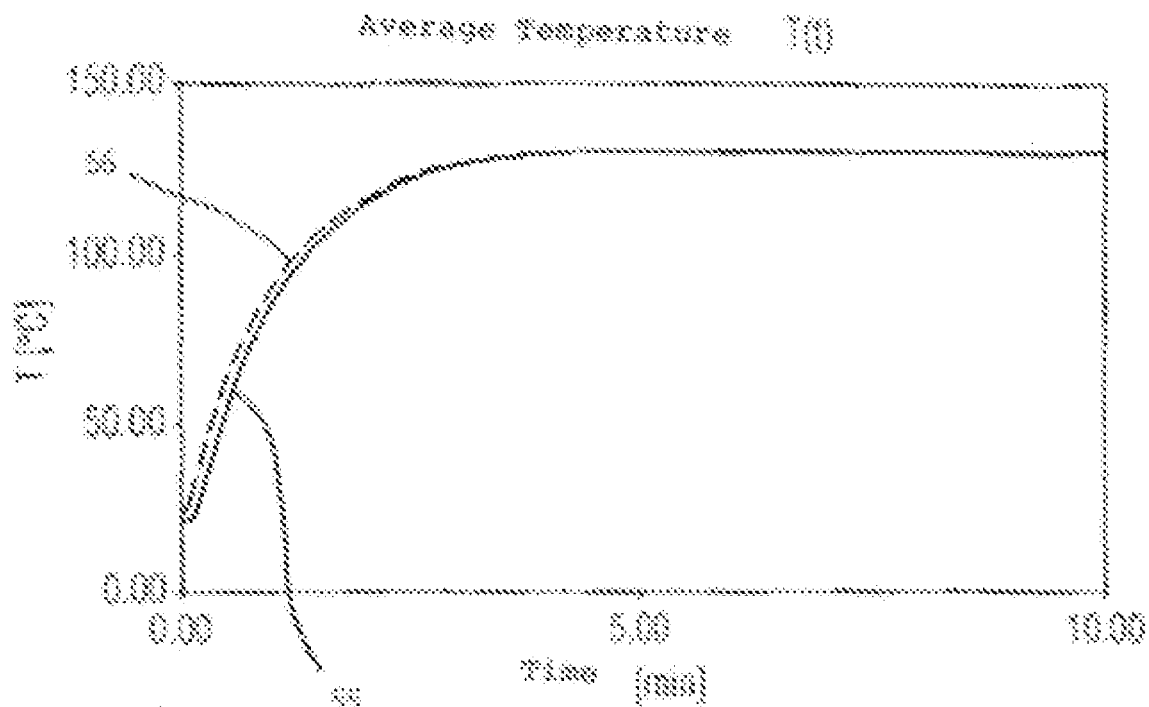
FIG. 5 a graphical illustration of the average temperature on a surface of the substrate during a thermal treatment according to this invention and according to a comparable method.
Figure 6:
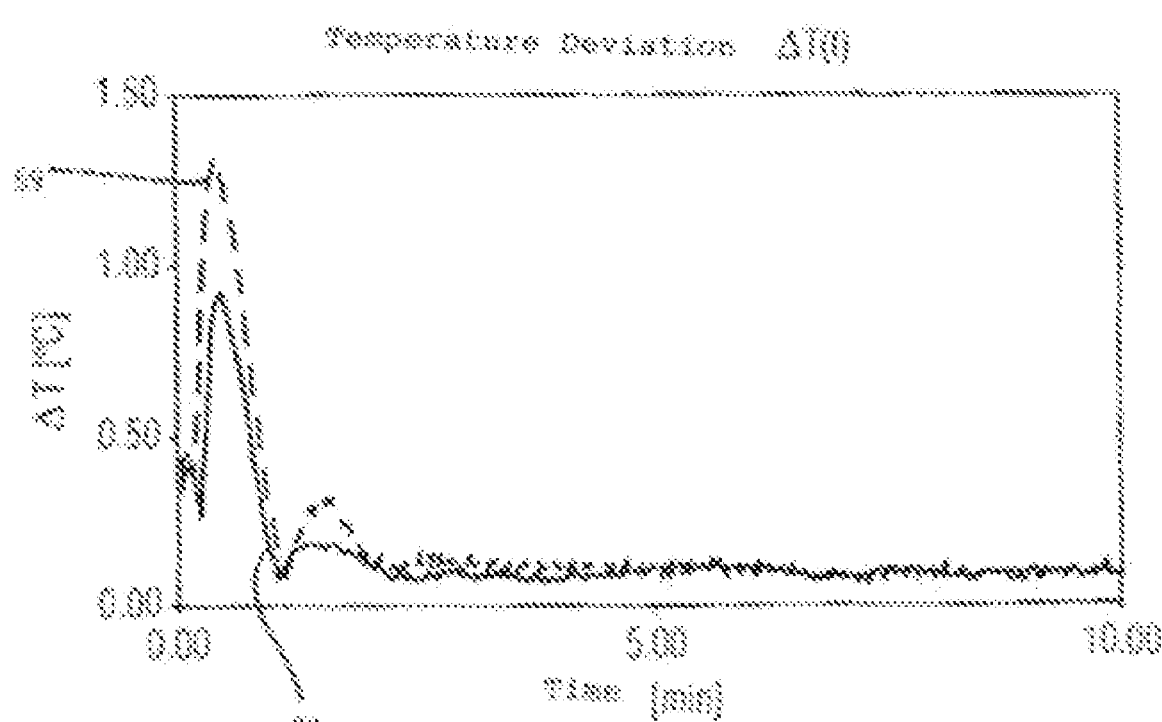
FIG. 6 a graphical illustration of local temperature deviations on a substrate surface with a thermal treatment according to this Invention in comparison with a thermal treatment according to a comparable method.

FIGS. 5 and 6 show a comparison of an average temperature T(t) or of a temperature deviation ΔT(t) on a substrate surface between a thermal treatment with controlled air suction according to the example of an embodiment described above, and a thermal treatment without controlled air suction. In FIG. 5, the curve 55 shows the average temperature T(t) on the substrate surface dependent upon time during a thermal treatment according to this invention, i.e. with controlled air suction, and curve 56 shows the average temperature T(t) on the surface of the substrate during the course of a process without controlled air suction. Curves 55 and 56 hardly differ, and it can therefore be seen that the controlled air suction only has a small influence upon the average temperature T(t) on a substrate surface.

In FIG. 6, the curve 58 shows a temperature deviation ΔT(t) between different location points on a surface of a substrate during a thermal treatment according to this invention, i,e, with controlled air suction. On the other hand, curve 58 shows a temperature deviation ΔT(t) between corresponding location points on a substrate during a thermal treatment without controlled air suction. FIG. 6 clearly shows that the temperature homogeneity, in particular at the start of the thermal treatment during a process according to this Invention, is clearly better than during the comparison process. This is due, among other things, to the fact tied by means of the controlled air suction, a faster influence upon the temperature in the edge region of the heating plate and of the externally positioned heating elements is possible such that edge effects can be quickly evened out. Furthermore, as can be seen In FIG. 6, the temperature deviation is in a region in which a substantially constant temperature should be provided, substantially the same in both processes, so that this invention provides in particular an improvement of homogeneity, for example in a heat-up phase, i.e. during a temperature change. In the same way, an improvement in homogeneity during a cooling phase is to be expected.

Figure 4:
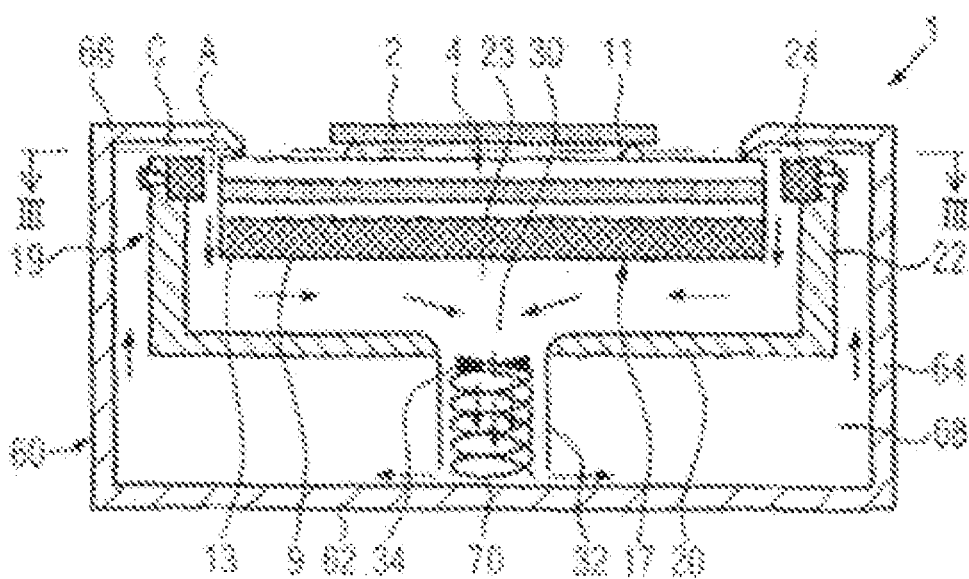
FIG. 4 a schematic cross-sectional view of the device according to FIG. 3.

FIGS. 3 and 4 show an alternative heating device 1 according to this invention. In FIGS. 3 and 4, the same reference numbers are used in so far as the same or similar elements are being indicated. FIG. 3 shows a sectional view of a heating device 1 along line III-III in FIG. 4, and FIG. 4 shows a cross-sectional view of the heating device 1.

In order to simplify the illustration, a cover like the cover 36 according to FIG. 2, is not shown in FIGS. 3 and 4.

The heating device 1 has substantially the same structure as the heating device according to FIGS. 1 and 2 with regard to a heating plate unit 17 having a heating plate 4, heating elements 9 and an insulation plate 13. Once again, supporting elements 11 are provided for holding a substrate 2, at a distance, over the heating plate 4.

A frame element 19 with a bottom wail 20 and side walls 22, as well as elements 24 disposed adjustably on the same, are also provided. However, the frame element 19 is surrounded by a further frame element 60 having a bottom wall 82, side walls 84 and an upper wall 68. The upper wail 66 is positioned in contact with the upper side of the heating plate 4 at its edge region, as shown in FIGS. 3 and 4, and has substantially the same function as the deflection element 26 according to the first embodiment. Between the frame element 19 and the frame element 60 a flow chamber 68 is formed which is connected by a gap C to gap A formed between the frame element 19 and the heating plate unit 17. By means of the middle opening 30 in the bottom wall 20 of the frame element 19, a flow space 23 formed between the lower side of the heating plate unit 17 and the bottom wall 20 of the frame element 19 is connected to the flow chamber 68.

In the region of the middle opening 30, a suction pipe 32 is once again provided in which a blower 34 is disposed in order to suck out air from the flow space 23 and convey it into the flow chamber 68. In this way, a closed flow circuit is provided between the two frame elements and the heating plate unit 17 which is illustrated by several flow arrows in FIG. 4. A cooling/heating device 70 is disposed in the region of the suction pipe 32 in order to bring air circulated through the circuit to a desired temperature. The air is preferably cooled during circulation to a predetermined temperature in order to provide specific cooling in the region of the gap A in the edge region of the heating plate 4 and cooling in the edge region of the externally positioned heating elements 9.

Operation of this invention substantially corresponds to the previously described operation, it being possible, as an additional control parameter, to control the temperature of the air conveyed through the gap A.

Figure 10:
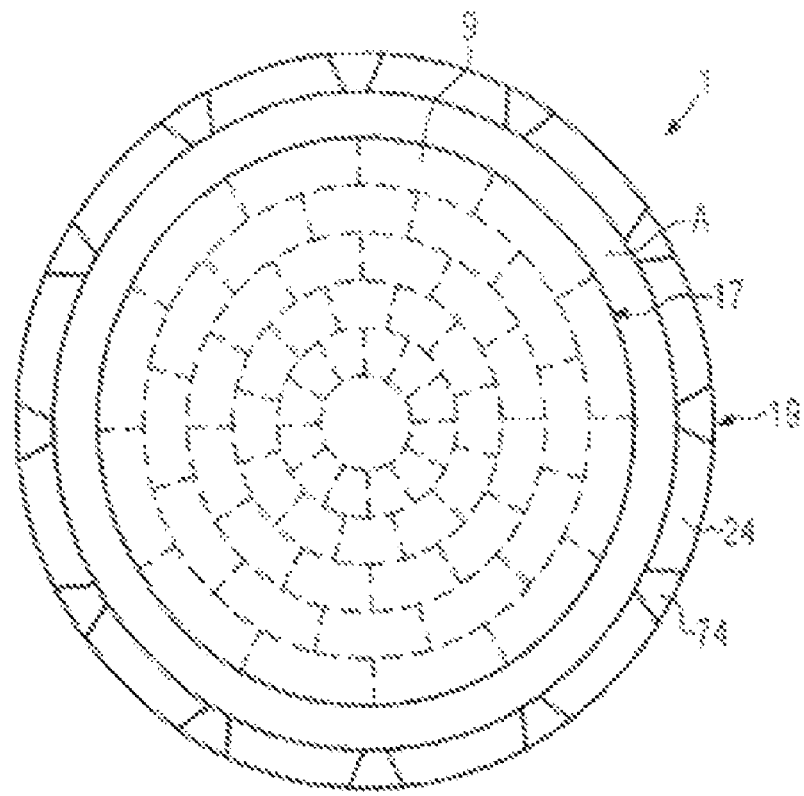
FIG. 10 a schematic top view of an alternative heating device of the invention.
Figure 11:
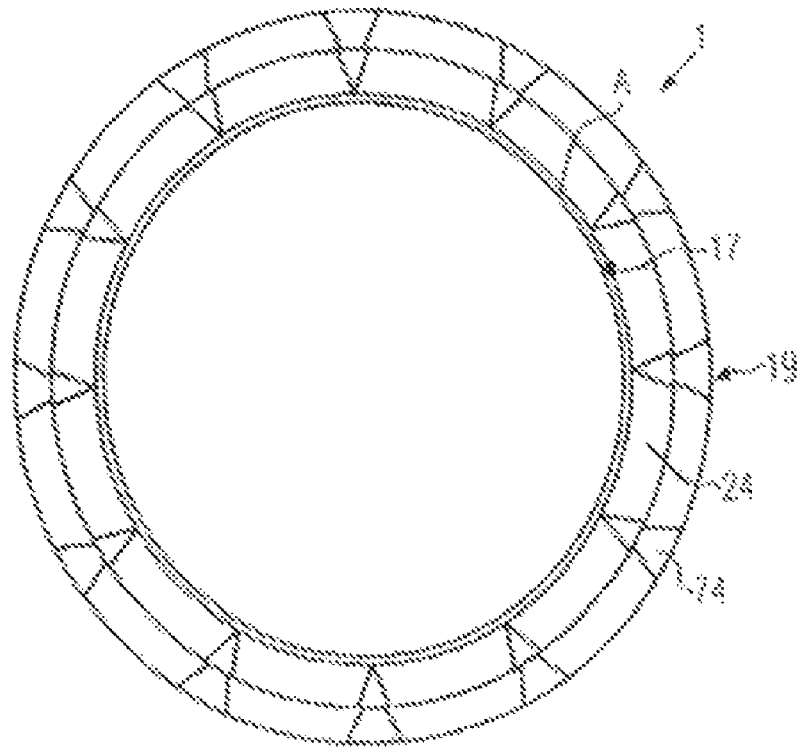
FIG. 11 a schematic top view of the heating device according to FIG. 10, with adjustable elements of the device being shown in a different position.
Figure 12:
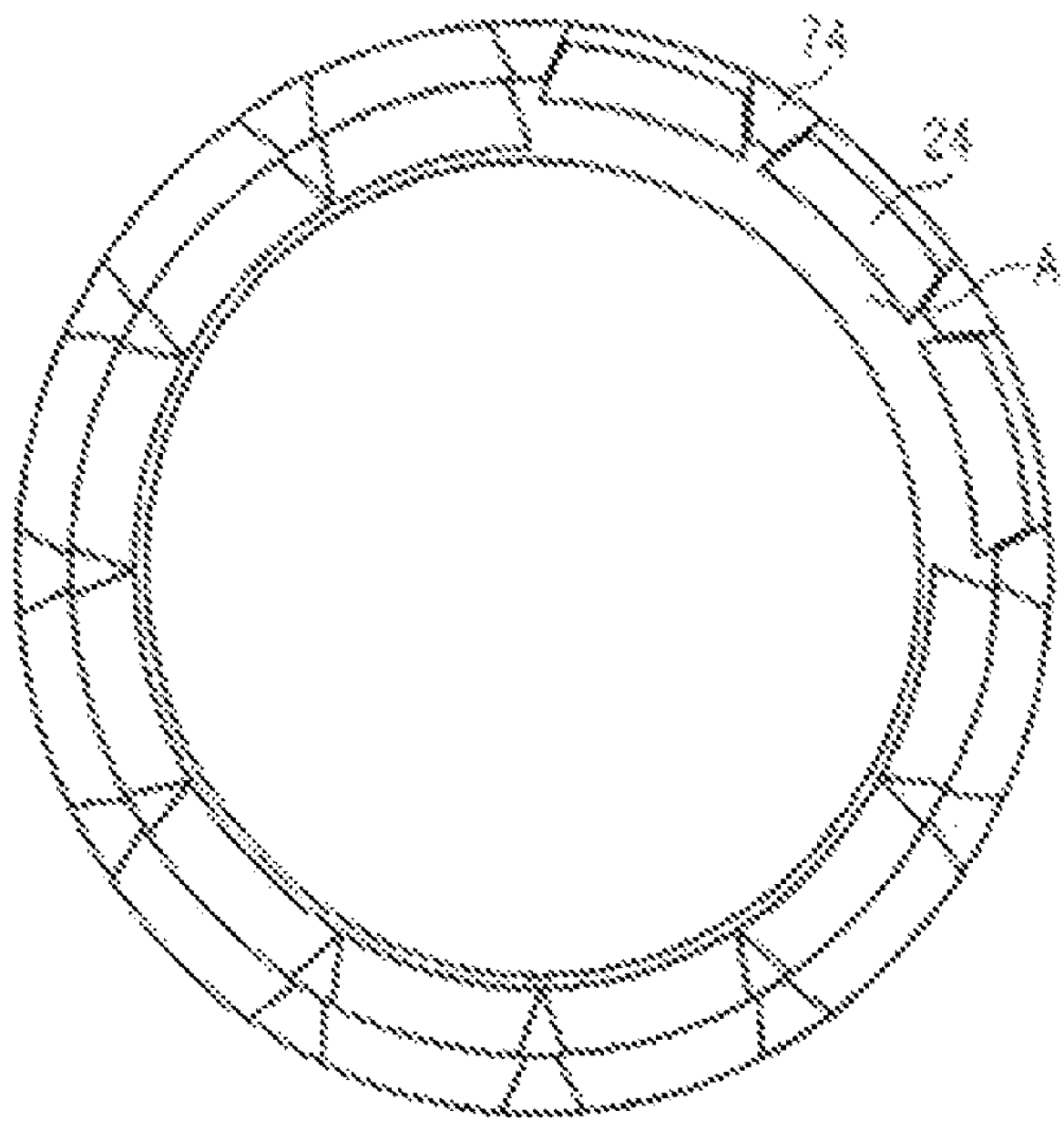
FIG. 12 a further schematic top view of a heating device according to FIG. 10, with adjustable elements of the device again being shown in different positions.

As is clearly evident to one of skill in the art, the flow direction shown in FIG. 4 could obviously also be inverted, i.e. the blower 34 sucks in air from the flow chamber 88, and conveys if into the flow chamber 23. Instead of air, another cooling gas could also be used In the flow circuit FIGS. 10 to 12 show different top views of a heating device 1 according to a further embodiment of the present invention, with adjustable elements of the device 1 being shown in different positions. In the description of the embodiment according to FIGS. 10 to 12, the same reference numbers as in the previous embodiments are used in so far as identical or equivalent elements are indicated.

The heating device 1 has a beating plate unit 17 which In the top view of the illustrated embodiment is round, and is provided for the thermal treatment of round substrates. The heating plate unit 17 has substantially the same structure as the heating plate unit 17 according to the preceding embodiments, consisting of an upper heating plate and individual heating elements 9 positioned below these, which are Illustrated schematically in FIG. 10 by dashed lines. The individual heating elements 9 can take on different forms, and any number of heating elements can also be chosen. However, the arrangement of the heating elements 9 should if at all possible have circular symmetry. According to the example of an embodiment shown a plurality of ring segment shaped heating elements 9 are provided in smaller and smaller concentric ring regions.

Furthermore, the device 1 has a frame element 19 which surrounds the heating plate unit 17 in a radial direction and on its rear side. In a floor wall (not shown in detail) of the frame unit 19, a middle opening Is once again provided which: is connected to a suction pipe and a blower disposed therein.

On the frame element 19, a plurality of adjustable elements 24 are once again provided which are in the form of ring segments. Between the respective adjustable elements 24 a fixed part 74 of the frame element 19 is provided which is of a height which corresponds to the height of the adjustable elements 24.

The adjustable elements are adjustable between a maximum outwardly moved position according to FIG. 10 and a maximum inwardly moved position according to FIG. 11 In order to change a gap A formed between the fame element 19 and the heating plate unit. 17. Individual adjustment of the elements 24 is possible, as well as an adjustment in groups. An example of a setting of the adjustable elements 24 with which different gap sizes A are provided in the circumferential direction, for example to even out local temperature inhomogeneities, is shown in FIG. 12.

Operation of the heating device 1 according to this invention substantially corresponds to operation of the device according to the preceding embodiments.

The invention was described above in detail using preferred embodiments of the invention without, however, being limited to the specific embodiments shown. The features of the different embodiments can for example be freely combined and exchanged with one another as far as they are compatible. Furthermore, different forms of the heating plate unit and the frame unit are of course also conceivable. Temperature control of the gas conveyed through the gap A is, for example, also possible with the embodiment according to FIGS. 1 and 2 when the flow gap B is connected to a gas source which makes possible temperature control of the gas, as for example an air conditioning system.

The specification incorporates by reference the disclosure of German priority document 10 2004 055 449.8 filed Nov. 17, 2004 and PCT/EP2005/012143 filed Nov. 12, 2005.

The present invention is, of course, in no way restricted to the specific disclosure of the specification and drawings, but also encompasses any modifications within the scope of the appended claims.

The invention claimed is:

1. A method of thermally treating substrates, including the steps of:
bringing a substrate into contact with, or spacing the substrate slightly from, a heating plate, wherein said heating plate is heated, on a side remote from the substrate, by a plurality of separately controllable heating elements;
providing a frame that radially surrounds said heating plate and is spaced from said heating plate;
conveying gas through a gap between said frame and at least one edge of said heating plate in such a way that the gas does not come into contact with the substrate;
changing the width of the gap along at least a portion of an edge of said heating plate prior to and/or during a thermal treatment of a substrate; and
controlling at least one of a quantity and a temperature of the gas in order to influence a temperature of said at least one edge of said heating plate.

2. A method according to claim 1, wherein the width of the gap is locally changed in a range of between 0 and 5 mm.

3. A method according to claim 2, wherein the width of the gap is locally changed in the range of between 1 and 5 mm.

4. A method according to claim 1, which includes the further step of deflecting the gas at a deflection element prior to entry of the gas into the gap.

5. A method according to claim 1, wherein the gas is ambient air.

6. A method according to claim 1, wherein the gas is a cooling gas, and which includes the further step of circulating the cooling gas in a closed cooling circuit.

7. A method according to claim 1, wherein the temperature is controlled prior to entry of the gas into the gap.

8. A method according to claim 1, which includes the further step of controlling at least one of a quantity of gas conveyed through the gap, a width of the gap, and a temperature of the gas with the aid of a profile that is established prior to thermal treatment.

9. A method, according to claim 8, which includes the further step of locally measuring a temperature on a side of a substrate remote from the heating plate and changing the profile established prior to the thermal treatment for the quantity of gas conveyed through the gap, the width of the gap, and/or the temperature of the gas as a function of the measured temperature on a substrate if temperature differences between different locations on the surface of the substrate exceed a threshold value.

10. A method according to claim 9, which includes the further steps of storing a profile changed during a thermal treatment for the quantity of gas conveyed through the gap, the width of the gap and/or the temperature of the gas, and using the changed profile for a subsequent treatment as a newly established profile.

11. A method according to claim 1, which includes the further steps of locally measuring a temperature on a side of the substrate remote from the heating plate, measuring the temperature of each heating element, and regulating the temperature of each heating element using a PID regulation algorithm in which the measured temperature of the heating element is entered as an actual value, wherein a desired profile of the temperature for the PID regulation algorithm, which was determined prior to the thermal treatment, is changed as a function of the temperature measured on the substrate if temperature differences between different locations on the surface of the substrate exceed a threshold value.

12. A method according to claim 11, which includes the further steps of storing a desired profile changed during a thermal treatment, and using the stored desired profile for a subsequent treatment as a newly established desired profile.

13. A method according to claim 1, which includes the further steps of locally measuring a structure width, in particular a lacquer structure width, on a surface of the substrate after a thermal treatment of the substrate, with the aid of the measurement calculating a location-specific temperature profile of the surface of the substrate, and setting the quantity of gas conveyed through the gap, the width of the gap, and/or a controlled profile for the heating elements for a subsequent thermal treatment of a substrate as a function of the calculated temperature profile on the substrate.

14. A device for thermally treating substrates, comprising:
a heating plate (4);
means (11) for holding a substrate in contact with, or slightly spaced from, said heating plate (4);
a plurality of separately controllable heating elements (9) disposed on a side of said heating plate (4) remote from the substrate;
a frame (19) that radially surrounds said heating plate (4), wherein said frame (19) is spaced from said heating plate to form at least one gap (A) between said frame (19) and at least one edge of said heating plate (4);
at least one device (34) for conveying gas through said at least one gap (A), wherein said at least one device (34) is adapted to control at least one of a quantity and a temperature of a gas conveyed through said at least one gap (A), further wherein at least one element (24) is provided for a local adjustment of a width of said at least one pap (A), and wherein said at least one element (24) is adjustably disposed on said frame (19); and
means for guiding the gas such that the gas does not come into contact with the substrate.

15. A device according to claim 14, wherein the width of said at least one gap (A) is locally adjustable between 0 and 5 mm.

16. A device according to claim 15, wherein the width of said at least one gap (A) is locally adjustable between 1 and 5 mm.

17. A device according to claim 14, wherein a plurality of said elements (24) are disposed along an edge of said heating plate (4).

18. A device according to claim 14, wherein a contour of said at least one element (24) that faces said heating plate (4) is complementary to a contour of an oppositely disposed edge of said heating plate.

19. A device according to claim 14, wherein said frame (19) is provided with a bottom wall (20) and at least one side wall (22), wherein said at least one side wall radially surrounds said heating plate (4), wherein a flow space (23) is formed above said bottom wall (20) and is in communication with said at least one gap (A), and wherein said at least one device (34) for conveying gas through said at least one gap (A) is in communication with an opening (30) in said bottom wall (20).

20. A device according to claim 14, wherein a deflection element is in contact with an edge region of an upper side of said heating plate (4), and wherein said deflection element forms a flow channel at an end of said at least one gap (A).

21. A device according to claim 14, wherein said at least one gap (A) is adapted to be in communication with ambient air.

22. A device according to claim 14, wherein said at least one gap (A) is part of a closed flow circuit, and wherein a cooling and/or heating device (70) is disposed in said closed flow circuit.

23. A device according to claim 14, wherein a location-specific temperature measurement device is directed toward a surface of the substrate that is remote from said heating plate (4), and wherein a process control unit is connected to said temperature measurement device and said at least one device (34) for conveying gas through said at least one gap (A) in order to establish a temperature distribution on the surface of the substrate with the aid of measurement data from said temperature measurement device, and to control said at least one device (34) for conveying gas through said at least one gap (A) with the aid of the temperature distribution in order to control a quantity and/or a temperature of the gas conveyed through said at least one gap (A).

24. A device according to claim 14, wherein a temperature sensor is associated with each of said heating elements (9) in order to measure a temperature thereof, and wherein at least one PID regulator is provided and is connected with said heating elements (9) and said associated temperature sensors.

25. A device according to claim 24, wherein a PID regulator is provided for each of said heating elements (9).

26. A device according to claim 24, wherein a process control unit is connected to said at least one PID regulator and establishes, as a function of a temperature distribution on a substrate surface facing away from said heating plate (4), desired temperature values for individual ones of said heating elements (9) and conveys these values to said at least one PID regulator.

27. A device according to claim 14, wherein said at least one device (34) for conveying gas through said at least one gap (A) is disposed centrally below said heating plate (4).

28. A device according to claim 14, wherein said at least one device (34) for conveying gas through said at least one gap (A) is a suction device.

29. A device according to claim 14, wherein said at least one device (34) for conveying gas through said at least one gap (A) is provided with a control unit in order to adjust at least one of a quantity of gas conveyed through said at least one gap and a temperature of the gas.

30. A device according to claim 14, which includes a device for a location-specific measurement of a structure width, in particular a lacquer structure width on a surface of a substrate.

* * * * *